(12) United States Patent
Oka et al.

(10) Patent No.: US 10,971,385 B2
(45) Date of Patent: Apr. 6, 2021

(54) SUBSTRATE PROCESSING APPARATUS AND TRANSFER POSITION CORRECTING METHOD

(71) Applicant: Tokyo Electron Limited, Tokyo (JP)

(72) Inventors: Hiroki Oka, Nirasaki (JP); Hiroshi Narushima, Nirasaki (JP); Sho Otsuki, Miyagi (JP); Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/655,504

(22) Filed: Oct. 17, 2019

(65) Prior Publication Data

US 2020/0126828 A1    Apr. 23, 2020

(30) Foreign Application Priority Data

Oct. 18, 2018    (JP) ............................. JP2018-196683

(51) Int. Cl.
| | |
|---|---|
| *H01L 21/67* | (2006.01) |
| *H01L 21/677* | (2006.01) |
| *B65G 47/91* | (2006.01) |
| *H01L 21/687* | (2006.01) |
| *H01L 21/683* | (2006.01) |

(52) U.S. Cl.
CPC ........ *H01L 21/67259* (2013.01); *B65G 47/91* (2013.01); *H01L 21/67742* (2013.01); *H01L 21/6833* (2013.01); *H01L 21/68707* (2013.01); *H01L 21/68742* (2013.01)

(58) Field of Classification Search
CPC .... H01L 21/687; H01L 21/683; H01L 21/677
See application file for complete search history.

(56) References Cited

U.S. PATENT DOCUMENTS

| | | | | |
|---|---|---|---|---|
| 2008/0013089 | A1* | 1/2008 | Ishii | ...................... G03F 9/7011 |
| | | | | 356/400 |
| 2009/0085594 | A1* | 4/2009 | Yamamoto | ......... G01R 31/2891 |
| | | | | 324/762.05 |
| 2010/0008688 | A1* | 1/2010 | Kimura | .................... H01L 21/68 |
| | | | | 399/66 |

(Continued)

FOREIGN PATENT DOCUMENTS

| | | |
|---|---|---|
| JP | 2007-251090 A | 9/2007 |
| JP | 2013-045817 A | 3/2013 |

*Primary Examiner* — Vincent H Tran
(74) *Attorney, Agent, or Firm* — Pearne & Gordon LLP

(57) ABSTRACT

A substrate processing apparatus includes a transfer device, having a first pick configured to hold the substrate, configured to transfer a substrate; a detecting device configured to detect a position of the substrate; a susceptor configured to place the substrate thereon; an elevating device configured to move the substrate up and down; and a control device. The control device comprises an adjuster configured to perform a teaching processing; a detector configured to deliver the substrate from the first pick to the susceptor and from the susceptor to the first pick, and configured to detect a first position of the substrate, which is delivered from the susceptor to the first pick, by the detecting device; and a corrector configured to correct the position of the first pick based on a deviation amount between the first position of the substrate and a reference position.

8 Claims, 10 Drawing Sheets

(56) References Cited

U.S. PATENT DOCUMENTS

| | | | |
|---|---|---|---|
| 2010/0255663 A1* | 10/2010 | Jung | B23K 26/0853 |
| | | | 438/487 |
| 2011/0178631 A1* | 7/2011 | Kondoh | H01L 21/68 |
| | | | 700/218 |
| 2012/0130529 A1* | 5/2012 | Shindo | H01L 21/67259 |
| | | | 700/114 |
| 2012/0325148 A1* | 12/2012 | Yamagishi | H01L 21/68742 |
| | | | 118/723 R |
| 2013/0053997 A1* | 2/2013 | Ohashi | H01L 21/67742 |
| | | | 700/103 |
| 2013/0180448 A1* | 7/2013 | Sakaue | H01L 21/67742 |
| | | | 118/696 |
| 2016/0111311 A1* | 4/2016 | Lee | H01L 21/67778 |
| | | | 700/213 |
| 2016/0293467 A1* | 10/2016 | Caveney | H01L 21/67742 |
| 2017/0050211 A1* | 2/2017 | Inagaki | B05D 1/005 |
| 2018/0350644 A1* | 12/2018 | Matsuura | H01L 21/683 |
| 2018/0363161 A1* | 12/2018 | Takahashi | C25D 17/06 |

* cited by examiner

CONTROL DEVICE — 60

SUBSTRATE PROCESSING APPARATUS AND TRANSFER POSITION CORRECTING METHOD

CROSS-REFERENCE TO RELATED APPLICATION

This application claims the benefit of Japanese Patent Application No. 2018-196683 filed on Oct. 18, 2018, the entire disclosures of which are incorporated herein by reference.

TECHNICAL FIELD

The various aspects and embodiments described herein pertain generally to a substrate processing apparatus and a transfer position correcting method.

BACKGROUND

In a manufacturing process for a semiconductor device, there is used, as an example, a so-called multi-chamber vacuum processing apparatus. In this multi-chamber vacuum processing apparatus, a plurality of vacuum processing chambers is disposed around a vacuum transfer chamber in which a transfer device is accommodated. A substrate is transferred into the vacuum processing chamber via the vacuum transfer chamber, and a vacuum processing is performed on the substrate. The transfer device is equipped with a substrate support (pick) at a leading end thereof, and this substrate support (pick) supports the substrate. The transfer device transfers the substrate to a susceptor provided within the processing chamber, and places the substrate on the susceptor. To transfer the substrate onto the susceptor with high accuracy, it is important to carry out position adjustment between the pick of the transfer device and the susceptor. For the purpose, a teaching processing of adjusting a position of the pick of the transfer device is performed.

In this regard, there is known a technique of adjusting the position of the pick as follows. In this technique, when performing the teaching processing, the substrate placed at a set position on the susceptor is transferred to a position detecting device within the vacuum transfer chamber by a pick of a transfer arm, and a position of the substrate is detected by the position detecting device. Then, by using the detection result, the position of the pick is adjusted.

Patent Document 1: Japanese Patent Laid-open Publication No. 2007-251090

Patent Document 2: Japanese Patent Laid-open Publication No. 2013-045817

SUMMARY

In one exemplary embodiment, a substrate processing apparatus includes a transfer device configured to transfer a substrate, the transfer device having a first pick configured to support the substrate; a detecting device configured to detect a position of the substrate transferred by the transfer device; a processing chamber connected to a transfer chamber in which the transfer device and the detecting device are accommodated; a susceptor configured to place the substrate thereon, the susceptor being provided within the processing chamber; an elevating device configured to move the substrate up and down, the elevating device being configured to be protruded from and retreated into the susceptor; and a control device configured to control the transfer device and the elevating device. The control device comprises an adjuster configured to perform a teaching processing of adjusting a position of the first pick of the transfer device; a detector configured to deliver the substrate from the first pick to the susceptor and from the susceptor to the first pick by controlling the transfer device and the elevating device, and configured to detect a first position of the substrate, which is delivered from the susceptor to the first pick, by the detecting device; and a corrector configured to correct the position of the first pick based on a deviation amount between the first position of the substrate and a previously detected reference position.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
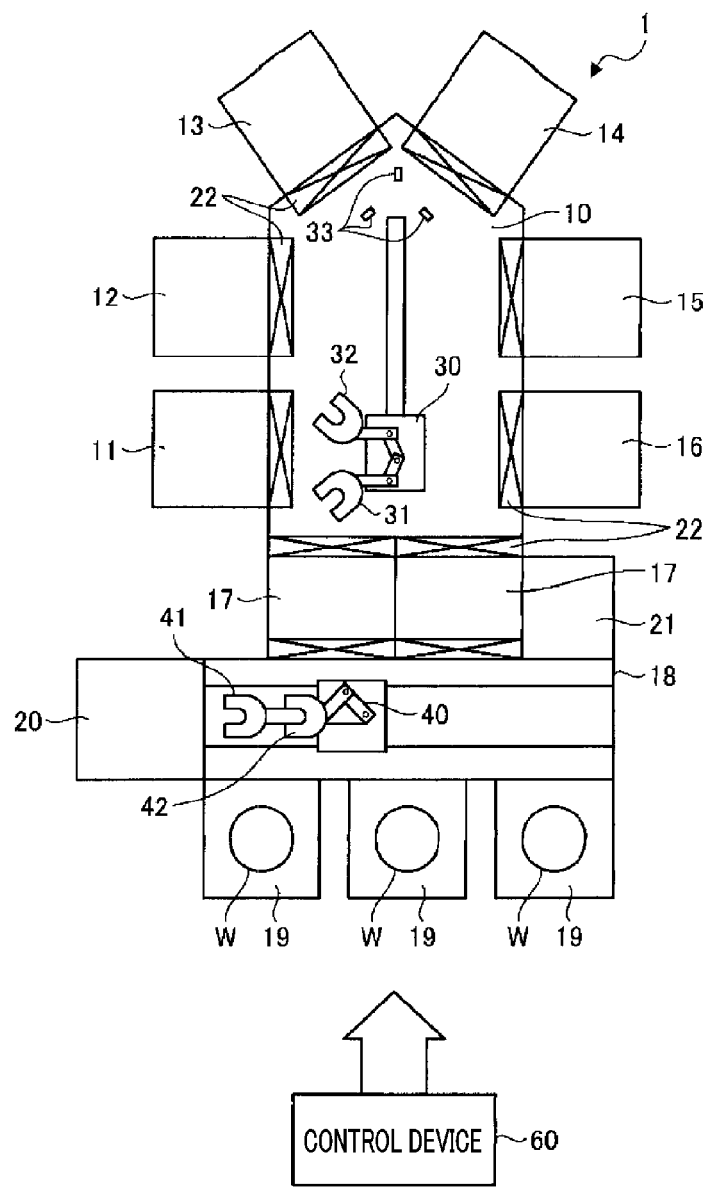
FIG. 1 is a plan view illustrating a configuration example of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a transfer position correcting method will be described in detail with reference to the accompanying drawings. In the various drawings, same or corresponding parts will be assigned same reference numerals. Further, it should be noted that the present disclosure is not limited to the exemplary embodiments.

FIG. 1 is a plan view illustrating a configuration example of a substrate processing apparatus 1 according to an exemplary embodiment. The substrate processing apparatus 1 shown in FIG. 1 may also be referred to as a multi-chamber system. A vacuum transfer chamber 10 is provided at a central portion of the substrate processing apparatus 1, and a plurality of (six in the present exemplary embodiment) vacuum processing modules 11 to 16 each configured to perform a processing on a wafer W is disposed around the vacuum transfer chamber 10. A configuration of the vacuum processing modules 11 to 16 will be elaborated later.

Two load lock chambers 17 are provided at a front side (lower side in the drawing) of the vacuum transfer chamber 10, and an atmospheric transfer chamber 18 configured to transfer the wafer W in the atmosphere is provided at a front side (lower side in the drawing) of the load lock chambers 17. Further, the wafer W is also referred to as 'substrate.' Further, a plurality of (three in FIG. 1) placing units 19, on which a substrate container (a cassette or a FOUP) configured to accommodate therein a multiple number of wafers W is placed, is provided at a front side (lower side in the drawing) of the atmospheric transfer chamber 18. Further, an orienter 20 configured to detect a position of the wafer W by using an orientation flat or a notch is disposed at a side (left side in the drawing) of the atmospheric transfer chamber 18. Further, a dummy storage 21 configured to accommodate therein dummy wafers is disposed at a side (right side in the drawing) of the load lock chambers 17.

Gate valves 22 are respectively provided between the load lock chambers 17 and the atmospheric transfer chamber 18, between the load lock chambers 17 and the vacuum transfer chamber 10, and between the vacuum transfer chamber 10 and the vacuum processing modules 11 to 16 to be airtightly closed or opened therebetween. Further, a transfer device 30 is provided within the vacuum transfer chamber 10. The transfer device 30 is configured as a well-known multi-joint transfer arm. That is, the transfer device 30 is equipped with a first pick 31 and a second pick 32, and is configured to be capable of supporting two wafers W with these picks. The transfer device 30 is configured to carry the wafers W into or out of the vacuum processing modules 11 to 16 and the load lock chambers 17.

Further, a position detecting device 33 configured to detect positions of the wafers W supported on the first pick 31 and the second pick 32 of the transfer device 30 is provided within the vacuum transfer chamber 10. This position detecting device 33 is configured to detect a position of a peripheral portion of the wafer W by using a plurality of (for example, three) optical sensors.

Moreover, a transfer device 40 is provided within the atmospheric transfer chamber 18. The transfer device 40 is configured as a well-known multi-joint transfer arm. That is, the transfer device 40 is equipped with a first pick 41 and a second pick 42, and is configured to be capable of supporting two wafers W with these picks. The transfer device 40 is configured to carry the wafers W or the dummy wafers into or out of the cassette or FOUP placed on the placing unit 19, the load lock chambers 17, the orienter 20, and the dummy storage 21.

Figure 2:
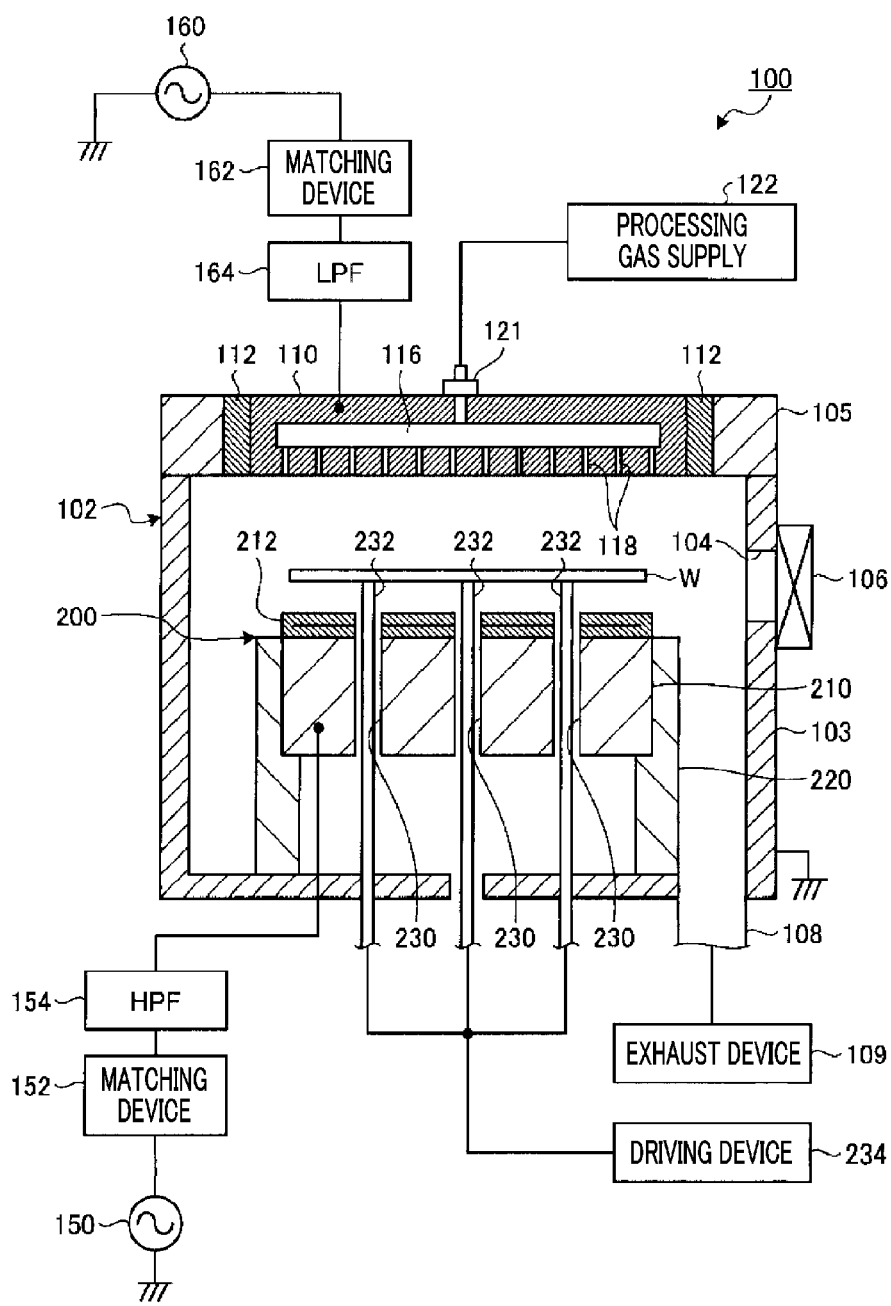
FIG. 2 is a schematic cross sectional view illustrating a configuration example of a vacuum processing module shown in FIG. 1.

FIG. 2 is a schematic cross sectional view illustrating a configuration example of the vacuum processing modules 11 to 16 shown in FIG. 1. FIG. 2 illustrates a plasma processing apparatus 100 as an example of the vacuum processing modules 11 to 16. The plasma processing apparatus 100 shown in FIG. 2 is equipped with a processing chamber 102 made of a conductive material such as aluminum. The processing chamber 102 is equipped with, for example, a cylindrical vessel main body 103 having a top opening; and a circular plate-shaped ceiling (cover) 105 configured to close a top opening of the vessel main body 103 in an openable manner. The processing chamber 102 is grounded.

A susceptor 200 configured to place the wafer W thereon is provided within the processing chamber 102. Further, an upper electrode 110 is disposed above the susceptor 200, facing the susceptor 200.

The susceptor 200 is equipped with a column-shaped lower electrode 210. The lower electrode 210 is made of, by way of non-limiting example, aluminum and is provided at a bottom of the processing chamber 102 with an insulating cylindrical holder 220 therebetween. The lower electrode 210 is formed to have a size corresponding to an outer diameter of the wafer W.

A first high frequency power supply 150 is connected to the lower electrode 210 via a matching device 152, and a second high frequency power supply 160 having a higher frequency than that of the first high frequency power supply 150 is connected to the upper electrode 110 via a matching device 162. Further, desirably, a high pass filter (HPF) 154 configured to filter a high frequency current introduced to the lower electrode 210 from the second high frequency power supply 160 is provided between the matching device 152 and the lower electrode 210, as depicted in FIG. 2. Furthermore, desirably, a low pass filter (LPF) 164 configured to filter a high frequency current introduced to the upper electrode 110 from the first high frequency power supply 150 is provided between the matching device 162 and the lower electrode 110.

The upper electrode 110 is disposed at a ceiling portion 105 of the processing chamber 102 with a shield ring 112 therebetween. The shield ring 112 covers a side surface of the upper electrode 110. The upper electrode 110 has a diffusion space 116 therein. A multiple number of discharge holes 118 through which a processing gas is discharged are formed at a bottom surface of the upper electrode 110 facing the susceptor 200.

The upper electrode 110 is provided with a gas inlet 121 through which the processing gas is introduced into the diffusion space 116. A processing gas supply 122 configured to supply the processing gas is connected to the gas inlet 121. The processing gas is diffused within the diffusion space 116 of the upper electrode 110 and then supplied into the processing chamber 102 from the discharge holes 118.

Disposed on a surface of the susceptor 200 is an electrostatic chuck 212 configured to attract and hold the wafer placed on the surface of the susceptor 200 by an electrostatic attracting force which is generated by a DC voltage applied thereto.

Further, the susceptor 200 is provided with a plurality of, for example, three pin through holes 230, and lifter pins 232 are respectively inserted in these pin through holes 230. The lifter pins 232 are connected to a driving device 234. The driving device 234 is configured to move the lifter pins 232 up and down within the pin through holes 230. Accordingly, the lifter pins 232 move the wafer W up and down. That is, if the lifter pins 232 are moved up, leading ends of the lifter pins 232 are protruded from the susceptor 200 and hold the wafer W thereon. Meanwhile, if the lifter pins 232 are lowered, the leading ends of the lifter pins 232 are retreated into the pin through holes 230, so that the wafer W is placed on the susceptor 200. The control over the lifter pins 232 (control over the driving device 234) is performed by a control device 60 to be described later. The lifter pins 232 and the driving device 234 are an example of an elevating device.

A gate valve 106 configured to open or close a substrate carry-in/carry-out opening 104 is provided at a sidewall of the processing chamber 102. Further, an exhaust opening is provided under the sidewall of the processing chamber 102. An exhaust device 109 including a vacuum pump (not shown) is connected to the exhaust opening via an exhaust line 108. By evacuating an inside of the processing chamber 102 by the exhaust device 109, the inside of the processing chamber 102 is maintained at a preset pressure during a plasma processing.

Referring back to FIG. 1, the substrate processing apparatus 1 is equipped with the control device 60. The control device 60 is a device configured to control operations of the substrate processing apparatus 1. The control device 60 may be, by way of example, a computer and is equipped with a storage and a controller. Programs for controlling various kinds of processings are stored in the storage. The controller reads out and executes the programs stored in the storage, thus controlling the operations of the substrate processing apparatus 1. Here, the controller may be implemented by, for example, a processor. As an example, the processor may be a CPU (Central Processing Unit), a FPGA (Field Programmable Gate Array), or the like. Further, the storage may be implemented by, for example, a memory. As an example, the memory may be a RAM (Random Access Memory) such as a SDRAM (Synchronous Dynamic Random Access Memory), a ROM (Read Only Memory), a flash memory, or the like.

Further, the programs stored in the storage of the control device 60 are recorded in a computer-readable recording medium and may be installed to the storage of the control device 60 from this recording medium. The computer-readable recording medium may be, by way of non-limiting example, a hard disk (HD), a flexible disk (FD), a compact disk (CD), a magnet optical disk (MO), a memory card, or the like.

Figure 3:
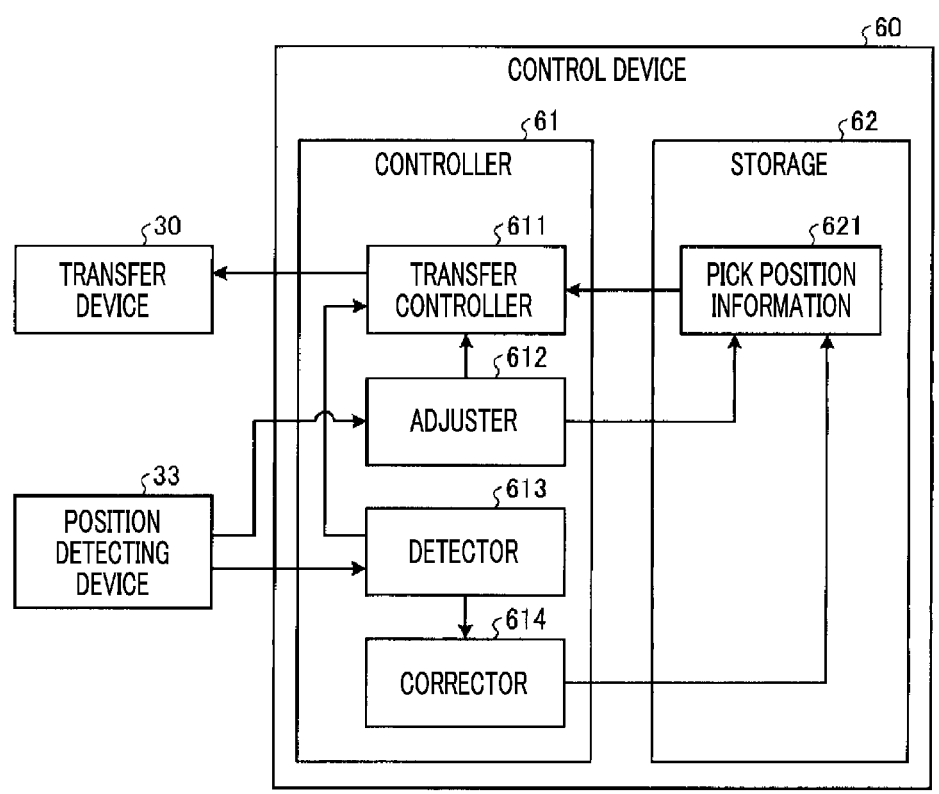
FIG. 3 is a block diagram illustrating a configuration example of a control device.

Here, a configuration of the control device 60 will be explained with reference to FIG. 3. FIG. 3 is a block diagram illustrating a configuration example of the control device 60. Here, FIG. 3 illustrates only constituent components necessary to describe a characteristic of the control device 60, while omitting illustration of other general constituent components.

As depicted in FIG. 3, the control device 60 includes a controller 61 and a storage 62. The controller 61 includes a transfer controller 611, an adjuster 612, a detector 613 and a corrector 614. The storage 62 has pick position information 621. The pick position information 621 includes a position of the first pick 31 and a position of the second pick 32 as a pick position.

The transfer controller 611 is configured to control the transfer device 30 based on the pick position indicated by the pick position information 621, thus allowing the wafer W to be delivered between the transfer device 30 and the susceptor (the susceptor 200 shown in FIG. 2) of each of the vacuum processing modules 11 to 16. By way of example, in case that a processing is performed in each of the vacuum transfer modules 11 to 16, the transfer controller 611 controls the transfer device 30 based on the pick position indicated by the pick position information 621, thus allowing the wafer W to be delivered between the transfer device 30 and the susceptor 200.

Here, operations of the first pick 31 and the lifter pins 232 in a carry-in and a carry-out of the wafer W will be described.

Figure 5A:
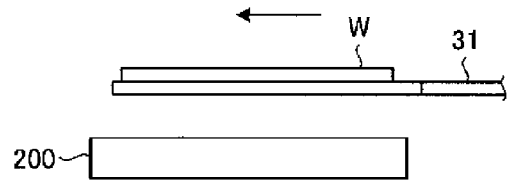
FIG. 5A is an explanatory diagram illustrating an example of a carry-in operation of a wafer W.
Figure 5B:
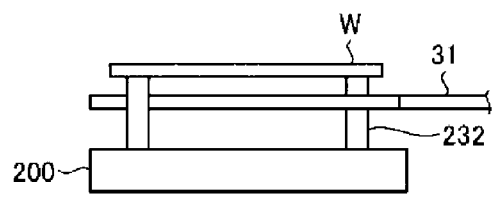
FIG. 5B is an explanatory diagram illustrating an example of the carry-in operation of the wafer W.
Figure 5C:
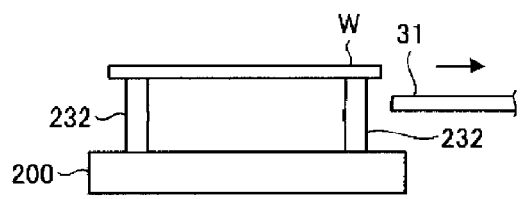
FIG. 5C is an explanatory diagram illustrating an example of the carry-in operation of the wafer W.
Figure 5D:
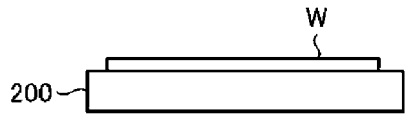
FIG. 5D is an explanatory diagram illustrating an example of the carry-in operation of the wafer W.

FIG. 5A to FIG. 5D are explanatory diagrams illustrating an example of the carry-in operation of the wafer W. Though only an operation of the first pick 31 is illustrated in FIG. 5A to FIG. 5D, the second pick 32 is operated in the same way. When carrying-in the wafer W, the transfer controller 611 advances the first pick 31 supporting the wafer W into the processing chamber 102 to move the first pick 31 to above the susceptor 200, as illustrated in FIG. 5A. Subsequently, the transfer controller 611 raises the wafer W from the first pick 31 by the lifter pins 232, as illustrated in FIG. 5B. Then, the transfer controller 611 retreats the first pick 31 from the processing chamber 102, as illustrated in FIG. 5C. Then, as illustrated in FIG. 5D, the transfer controller 611 moves the wafer W down by the lifter pins 232, thus allowing the wafer W to be delivered onto the susceptor 200.

Figure 6A:
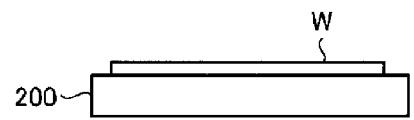
FIG. 6A is an explanatory diagram illustrating an example of a carry-out operation of the wafer W.
Figure 6B:
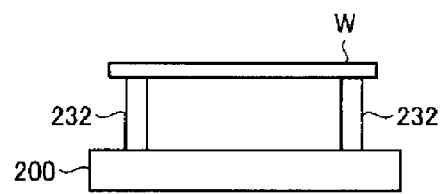
FIG. 6B is an explanatory diagram illustrating an example of the carry-out operation of the wafer W.
Figure 6C:
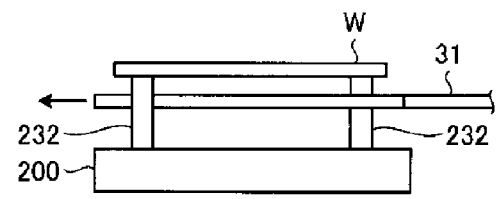
FIG. 6C is an explanatory diagram illustrating an example of the carry-out operation of the wafer W.
Figure 6D:
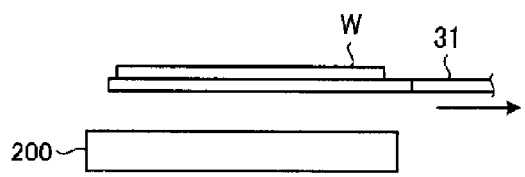
FIG. 6D is an explanatory diagram illustrating an example of the carry-out operation of the wafer W.

FIG. 6A to FIG. 6D are explanatory diagrams illustrating an example of the carry-out operation of the wafer W. Though only an operation of the first pick 31 is illustrated in FIG. 6A to FIG. 6D, the second pick 32 is operated in the same way. FIG. 6A illustrates an initial state in which the wafer W is placed on the susceptor 200. When carrying-out the wafer W, the transfer controller 611 raises the wafer W from the susceptor 200 by the lifter pins 232, as shown in FIG. 6B. Then, as illustrated in FIG. 6C, the transfer controller 611 advances the first pick 31 into the processing chamber 102 to move the first pick 31 to below the wafer W supported by the lifter pins 232. Thereafter, as illustrated in FIG. 6D, the transfer controller 611 lowers the wafer W by the lifter pins 232, thus allowing the wafer W to be delivered to the first pick 31.

As stated above, in the carry-in operation and the carry-out operation of the wafer W, by moving the wafer W up and down by the lifter pins 232, the wafer W is delivered from the first pick 31 (or the second pick 32) onto the susceptor 200 and from the susceptor 200 onto the first pick 31 (or the second pick 32).

Reference is made back to FIG. 3. The adjuster 612 is configured to perform a teaching processing of adjusting the position of the first pick 31 and the position of the second pick 32. The position of the first pick 31 and the position of the second pick 32 are positions in the horizontal direction. The detector 613 is configured to calculate correction values for adjusting the positions of the first and second picks 31 and 32, which are adjusted through the teaching processing, to more accurate positions. The corrector 614 is configured to correct the position of the first pick 31 and the position of the second pick 32 based on the correction values detected by the detector 613.

Here, an example of the teaching processing performed by the adjuster 612 will be explained with reference to FIG. 4. First, the wafer W is placed at a predetermined position on the susceptor 200 by using a preset jig. Then, the adjuster 612 delivers the wafer W from the susceptor 200 to the first pick 31 via the lifter pins 232 by controlling the transfer device 30 and the lifter pins 232 (process S101). Further, the control over the transfer device 30 is performed through the transfer controller 611 in response to an instruction from the adjuster 612. Then, the adjuster 612 transfers the wafer W delivered to the first pick 31 to the position detecting device 33 by controlling the transfer device 30. The position detecting device 33 detects a position of the wafer W (process S102). Subsequently, the adjuster 612 calculates a deviation amount between the detected position of the wafer W and the position of the first pick 31 indicated by the pick position information 621. Based on the calculated deviation amount, the adjuster 612 then adjusts (updates) the position (that is, an initial position) of the first pick 31 indicated by the pick position information 621 (process S103). Thereafter, the adjuster 612 delivers the wafer W from the first pick 31 to the second pick 32 via the lifter pins 232 by controlling the transfer device 30 and the lifter pins 232 (process S104). Then, the adjuster 612 transfers the wafer W delivered to the second pick 32 to the position detecting device 33 by controlling the transfer device 30. The position detecting device 33 detects the position of the wafer W (process S105). Subsequently, the adjuster 612 calculates a deviation amount between the detected position of the wafer W and a position of the second pick 32 indicated by the pick position information 621, and adjusts (updates) the position (that is, an initial position) of the second pick 32 indicated by the pick position information 621 based on the calculated deviation amount (process S106).

That is, in the above-stated teaching processing, when adjusting the position of the first pick 31, operations S113a and S113b shown in FIG. 9 to be described later are performed. The operation S113a is an operation through which the first pick 31 is transferred to below the wafer W supported by the lifter pins 232 after the wafer W is raised from the susceptor 200 by the lifter pins 232. The operation S113b is an operation through which the wafer W is lowered by the lifter pins 232 and delivered to the first pick 31. Through these upward and downward movements (elevating movements) of the wafer W by the lifter pins 232, there is caused a minute deviation in the position of the wafer W. Accordingly, the position of the wafer W detected in the process S102 includes the deviation caused by the operations S113a and S113b. For this reason, the position of the first pick adjusted by the teaching processing includes the deviation caused by the operations S113a and S113b.

Further, as depicted in FIG. 5A to FIG. 5D, in the actual transfer of the wafer W, operations S112a and S112b shown in FIG. 8 to be described later are performed on the first pick. The operation S112a is an operation through which the first pick 31 is transferred to above the susceptor 200 and the wafer W is raised from the first pick 31 by the lifter pins 232. The operation S112b is an operation through which the first pick 31 is retreated and the wafer W is lowered by the lifter pins 232 to be delivered onto the susceptor 200. Through these elevating movements of the wafer W by the lifter pins 232, there is caused a minute deviation in the position of the wafer W. Accordingly, if the wafer W is carried in by the first pick the position of which is adjusted through the above-described teaching processing, the wafer W is placed on the susceptor 200 with the deviations caused by the operations S112a, S112b, S113a and S113b.

Figure 10:
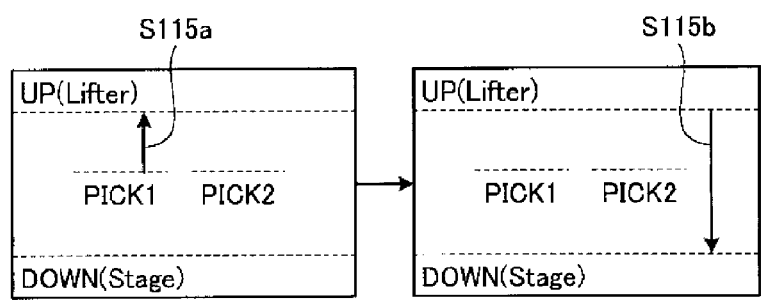
FIG. 10 is an explanatory diagram illustrating an example of the delivery of the wafer from the first pick onto the susceptor.

Further, in the above-described teaching processing, when adjusting the position of the second pick 32, an operation S115a shown in FIG. 10 and an operation S116b shown in FIG. 11 to be described later are performed. The operation S116b is an operation through which the wafer W is lowered by the lifter pins 232 to be delivered to the second pick 32. Further, the operation S115a shown in FIG. 10 is performed after the operations S113a and S113b which are performed when adjusting the first pick 31. Accordingly, in the adjustment of the position of the second pick 32, not only a deviation caused by the operations S115a and S116b but also the deviation caused by the operations S113a and S113b in the adjustment of the position of the first pick 31 is included.

Further, as shown in FIG. 5A to FIG. 5D, in the actual transfer of the wafer W, operations S117a shown in FIG. 12 and an operation S115b shown in FIG. 10 to be described later are performed on the second pick. The operation S117a is an operation through which the wafer W is raised from the second pick 32 by the lifter pins 232. The operation S115b is an operation through which the wafer W is lowered by the lifter pins 232 to be delivered onto the susceptor 200. Through these elevating movements of the wafer W by the lifter pins 232, there is caused a minute deviation in the position of the wafer W. Accordingly, if the wafer W is carried-in by the second pick the position of which is adjusted through the above-described teaching processing, the wafer W is placed on the susceptor 200 with the deviations caused by the operations S113a, S113b, S115a, S115b, S116b and S117a.

Thus, to place the wafer W at a more accurate position on the susceptor 200, the deviations caused by the operations S112a, S112b, S113b and S113b need to be corrected for the first pick 31, and the deviations caused by the operations S113a, S113b, S115a, S115b, S116b and S117a need to be corrected for the second pick.

In this regard, in the substrate processing apparatus 1 according to the exemplary embodiment, a deviation amount of the wafer W caused by the elevating movements of the wafer W through the lifter pins 232 is calculated by the detector 613 after the completion of the teaching processing, and the positions of the first pick 31 and the second pick 32 are corrected by the corrector 614.

Figure 7:
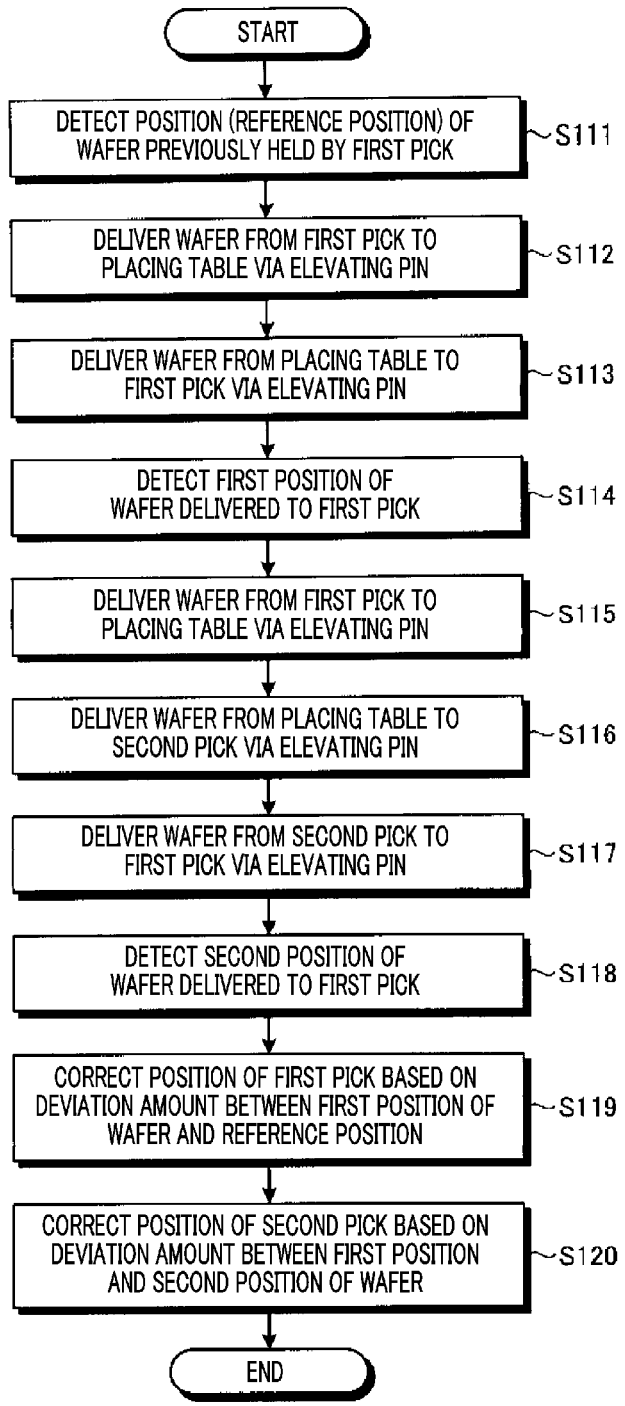
FIG. 7 is a flowchart illustrating an example of a flow of correction of a position of a first pick and a position of a second pick in the exemplary embodiment.

Now, a flow of the correction of the positions of the first pick 31 and the second pick 32 will be explained. FIG. 7 is a flowchart illustrating an example flow of the correction of the positions of the first pick 31 and the second pick 32 according to the exemplary embodiment.

As shown in FIG. 7, the detector 613 detects the position of the wafer W, which is previously supported on the first pick 31, by the position detecting device 33 as a 'reference position' (process S111).

Then, the detector 613 delivers the wafer W from the first pick 31 onto the susceptor 200 via the lifter pins 232 by controlling the transfer device 30 and the lifter pins 232 (process S112).

Figure 8:
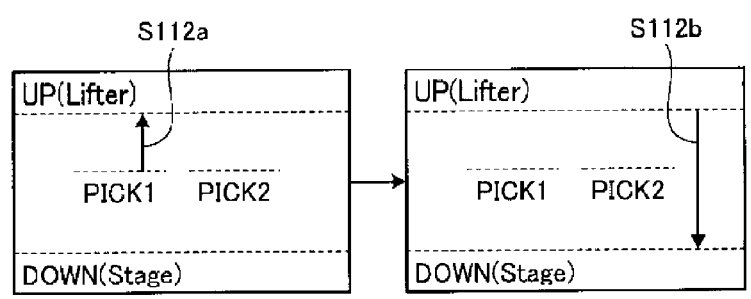
FIG. 8 is an explanatory diagram illustrating an example of a delivery of the wafer from the first pick onto a susceptor.

FIG. 8 is an explanatory diagram illustrating the delivery of the wafer W from the first pick 31 onto the susceptor 200 in the process S112. The detector 613 transfers the first pick 31 to above the susceptor 200 and raises the wafer W from the first pick 31 by the lifter pins 232 (process S112a). Then, the detector 613 retreats the first pick 31 and lowers the wafer W by the lifter pins 232 to thereby allow the wafer W to be delivered onto the susceptor 200 (process S112b).

Referring back to FIG. 7, the detector 613 delivers the wafer W from the susceptor 200 onto the first pick 31 via the lifter pins 232 by controlling the transfer device 30 and the lifter pins 232 (process S113).

Figure 9:
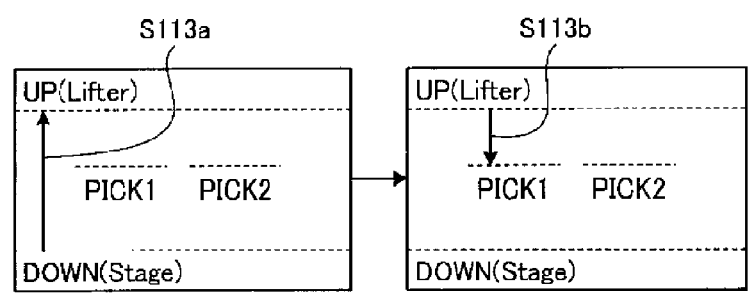
FIG. 9 is an explanatory diagram illustrating an example of a delivery of the wafer from the susceptor to the first pick.

FIG. 9 is an explanatory diagram illustrating the delivery of the wafer W from the susceptor 200 onto the first pick 31 in the process S113. The detector 613 raises the wafer W from the susceptor 200 by the lifter pins 232, and transfer the first pick 31 to below the wafer W supported by the lifter pins 232 (process S113a). Then, the detector 613 lowers the wafer W by the lifter pins 232 to deliver the wafer W onto the first pick 31 (process S113b).

Referring back to FIG. 7, the detector 613 then transfers the wafer W, which is delivered to the first pick 31 from the susceptor 200, to the position detecting device 33, and the position detecting device 33 detects a first position of the wafer W (process S114). The first position of the wafer W detected by the position detecting device 33 includes the deviations caused by the elevating movements of the processes S112a and S112b in FIG. 8 and the elevating movements of the processes S113a and S113b in FIG. 9. That is, by comparing the reference position and the first position of the wafer W, the deviation of the wafer W caused by the elevating movements of the processes S112a and S112b in FIG. 8 and the elevating movements of the processes S113a and S113b in FIG. 9 can be calculated.

Subsequently, the detector 613 delivers the wafer W from the first pick 31 onto the susceptor 200 via the lifter pins 232 by controlling the transfer device 30 and the lifter pins 232 (process S115).

FIG. 10 is an explanatory diagram illustrating the delivery of the wafer W from the first pick 31 onto the susceptor 200 in the process S113. In FIG. 10, the detector 613 transfers the first pick 31 to above the susceptor 200 and raises the wafer W from the first pick 31 by the lifter pins 232 (process S115a). Then, the detector 613 retreats the first pick 31 and lowers the wafer W by the lifter pins 232 to thereby allow the wafer W to be delivered onto the susceptor 200 (process S115b).

Reference is made back to FIG. 7. The detector 613 then delivers the wafer W from the susceptor 200 onto the second pick 32 via the lifter pins 232 by controlling the transfer device 30 and the lifter pins 232 (process S116).

Figure 11:
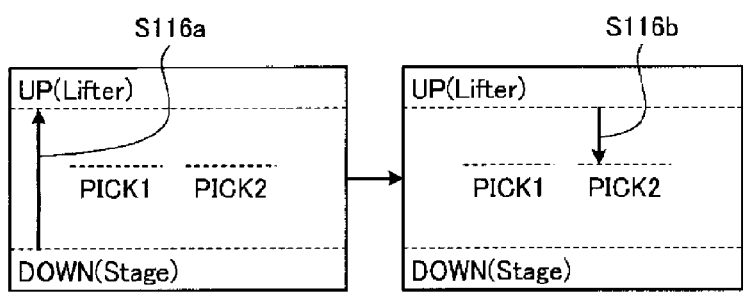
FIG. 11 is an explanatory diagram illustrating an example of a delivery of the wafer from the susceptor to the second pick.

FIG. 11 is an explanatory diagram illustrating the delivery of the wafer W from the susceptor 200 onto the second pick 32 in the process S116. The detector 613 raises the wafer W from the susceptor 200 by the lifter pins 232, and transfers the second pick 32 to below the wafer W supported by the lifter pins 232 (process S116a). Then, the detector 613 lowers the wafer W by the lifter pins 232 to deliver the wafer W onto the second pick 32 (process S116b).

Referring back to FIG. 7, the detector 613 delivers the wafer W from the second pick 32 to the first pick 31 via the lifter pins 232 by controlling the transfer device 30 and the lifter pins 232 (process S117).

Figure 12:
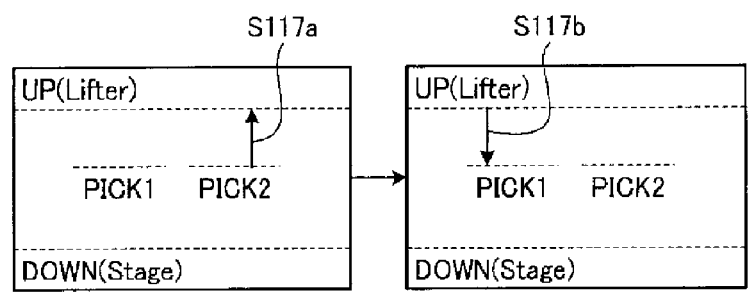
FIG. 12 is an explanatory diagram illustrating an example of a delivery of the wafer from the second pick to the first pick.

FIG. 12 is an explanatory diagram illustrating the delivery of the wafer W from the second pick 32 to the first pick 31 in the process S117. The detector 613 raises the wafer W from the second pick 32 by the lifter pins 232 (process S117a). Then, the detector 613 transfers the first pick 31 to below the wafer W supported by the lifter pins 232 and then lowers the wafer W by the lifter pins 232 to thereby allow the wafer W to be delivered onto the first pick 31 (process S117b).

Reference is made back to FIG. 7. The detector 613 then transfers the wafer W, which is delivered to the first pick 31 from the second pick 32, to the position detecting device 33, and the position detecting device 33 detects a second position of the wafer W (process S118). The second position of the wafer W detected by the position detecting device 33 includes the deviations caused by the elevating movements of the processes S115a and S115b in FIG. 10, the elevating movements of the processes S116a and S116b in FIG. 11 and the elevating movements of the processes S117a and S117b in FIG. 12. That is, by comparing the first position and the second position of the wafer W, the deviation amount of the wafer W caused by the elevating movements of the processes S115a and S115b in FIG. 10, the elevating movements of the processes S116a and S116b in FIG. 11 and the elevating movements of the processes S117a and S117b in FIG. 12 can be calculated. Here, since the elevating movement of the process S116a is the same as the elevating movement of the process S113a, the deviation amounts of the wafer W caused by these elevating movements are considered to be same. Further, since the elevating movement of the process S117b is the same as the elevating movement of the process S113b, the deviation amounts of the wafer W caused by these elevating movements are considered to be same. Accordingly, the deviation amount obtained by comparing the first position and the second position of the wafer W is equal to the deviation amount caused by the operations of the processes S113a, S113b, S115a, S115b, S116b and S117a.

Figure 4:
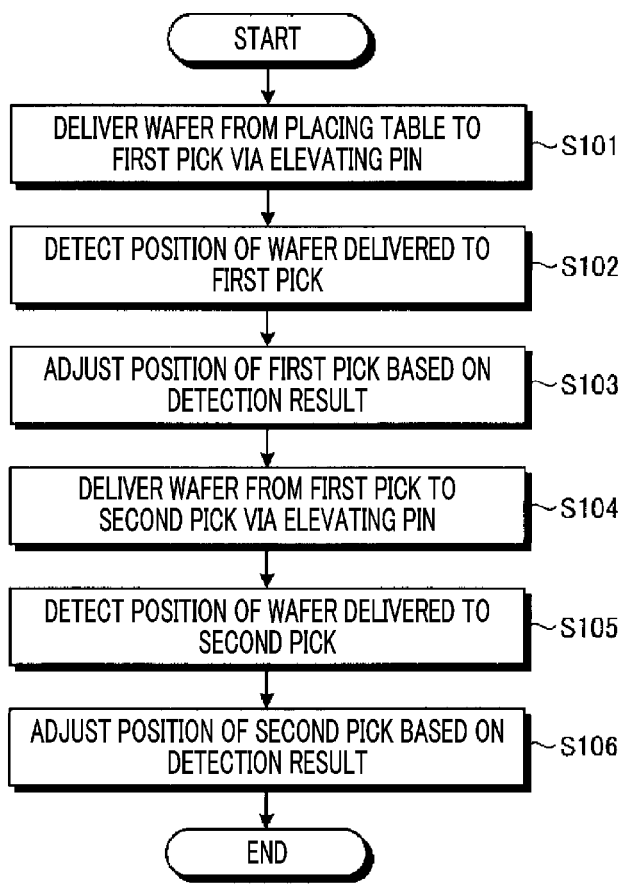
FIG. 4 is a flowchart illustrating an example of a flow of a teaching processing.

Upon the completion of the teaching processing shown in FIG. 4, the corrector 614 corrects a position of the first pick 31 based on a deviation amount between the first position of the wafer W and the 'reference position' previously detected in the process S111 (process S119).

Subsequently, the corrector 614 corrects the position of the second pick 32 based on the deviation amount between the second position of the wafer W and the first position of the wafer W detected in the process S114 (process S120).

As stated above, according to the exemplary embodiment, the wafer W is delivered from the first pick 31 to the susceptor 200 and from the susceptor 200 to the first pick 31 by controlling the transfer device 30 and the lifter pins 232 through the detector 613. Further, according to the exemplary embodiment, the first position of the wafer W delivered to the first pick 31 from the susceptor 200 by the detector 613 is detected by the position detecting device 33. Further, according to the exemplary embodiment, after the teaching processing is performed by the adjuster 612, the position of the first pick 31 is corrected by the corrector 614 based on the deviation amount between the previously detected reference position and the first position of the wafer W calculated by the detector 613. Accordingly, the position of the first pick 31 of the transfer device 30 is adjusted in consideration of the deviation amount in the position of the wafer W which is caused by the elevating movements of the wafer W by the lifter pins 232. As a result, the wafer W can be transferred with respect to the susceptor 200 with high accuracy.

Furthermore, according to the exemplary embodiment, the wafer W is delivered from the first pick 31 to the susceptor 200, from the susceptor 200 to the second pick 32 and from the second pick 32 to the first pick 31 by controlling the transfer device 30 and the lifter pins 232 through the detector 613. Further, according to the exemplary embodiment, the second position of the wafer W delivered to the first pick 31 from the second pick 32 by controlling the transfer device 30 and the lifter pins 232 through the detector 613 is detected by the position detecting device 33. Further, according to the exemplary embodiment, after the teaching processing is performed by the adjuster 612, the position of the second pick 32 is corrected by the corrector 614 based on the deviation amount between the first position and the second position of the wafer W calculated by the detector 613. Accordingly, the position of the second pick 32 of the transfer device 30 is adjusted in consideration of the deviation amount in the position of the wafer W which is caused by the elevating movements of the wafer W by the lifter pins 232. As a result, the wafer W can be transferred with respect to the susceptor 200 with high accuracy. Further, the controls over the transfer device 30 and the lifter pins 232 in the teaching processing and the correction processing are performed through the transfer controller 611 in response to the instruction from the adjuster 612 or the detector 613.

Other Exemplary Embodiments

So far, the substrate processing apparatus and the transfer position correcting method according to the exemplary embodiment have been described. However, the present disclosure is not limited thereto, and various other exemplary embodiments of the substrate processing apparatus and the transfer position correcting method may be achieved.

In the above-described exemplary embodiment, the position of the first pick 31 is corrected based on the deviation amount between the previously detected reference position and the first position of the single wafer W. However, the exemplary embodiment is not limited thereto. By way of example, the position of the first pick 31 may be corrected based on a deviation amount between an average of a multiple number of first positions and the reference position. In such a case, the detector 613 calculates the average of the multiple number of first positions by repeating the processing of delivering the wafer W from the first pick 31 to the susceptor and from the susceptor to the first pick 31 by controlling the transfer device 30 and the lifter pins and the processing of detecting the first position of the wafer W delivered to the first pick 31 from the susceptor by the position detecting device 33. Then, the corrector 614 corrects the position of the first pick 31 based on the deviation amount between the reference position and the average of the multiple number of first positions calculated by the detector 613.

Furthermore, in the above-described exemplary embodiment, the position of the second pick 32 is corrected based on the deviation amount between the previously detected first position and the second position of the single wafer W. However, the exemplary embodiment is not limited thereto. By way of example, the position of the second pick 32 may be corrected based on a deviation amount between an average of a multiple number of second positions and the first position. In such a case, the detector 613 calculates the average of the multiple number of second positions by repeating the processing of delivering the wafer W from the first pick 31 to the susceptor, from the susceptor to second pick 32 and from the second pick 32 to the first pick 31 by controlling the transfer device 30 and the lifter pins and the processing of detecting the position of the wafer W delivered from the second pick 32 to the first pick 31 by the position detecting device 33. Then, the corrector 614 corrects the position of the second pick 32 based on the deviation amount between the first position and the average of the multiple number of second positions calculated by the detector 613.

In the substrate processing apparatus according to the exemplary embodiment, it is possible to transfer the substrate onto the susceptor with high accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a transfer device configured to transfer a substrate, the transfer device having a first pick configured to support the substrate;
a detecting device configured to detect a position of the substrate transferred by the transfer device;
a processing chamber connected to a transfer chamber in which the transfer device and the detecting device are accommodated;
a susceptor configured to place the substrate thereon, the susceptor being provided within the processing chamber;
an elevating device configured to move the substrate up and down, the elevating device being configured to be protruded from and retreated into the susceptor; and
a control device configured to control the transfer device and the elevating device,
wherein the control device comprises:
an adjuster configured to perform a teaching processing of adjusting a position of the first pick of the transfer device;
a detector configured to deliver the substrate from the first pick to the susceptor and from the susceptor to the first pick by controlling the transfer device and the elevating device, and configured to detect a first position of the substrate, which is delivered from the susceptor to the first pick, by the detecting device; and
a corrector configured to correct the position of the first pick based on a deviation amount between the first position of the substrate and a previously detected reference position,
wherein the transfer device further comprises a second pick configured to hold the substrate,
the adjuster performs the teaching processing of adjusting the position of the first pick and a position of the second pick of the transfer device,
the detector delivers the substrate from the first pick to the susceptor, from the susceptor to the second pick and from the second pick to the first pick by controlling the transfer device and the elevating device, and detects a second position of the substrate, which is delivered from the second pick to the first pick, by the detecting device, and the corrector corrects the position of the second pick based on a deviation amount between the second position of the substrate and the first position of the substrate.

2. The substrate processing apparatus of claim 1, wherein the detector calculates an average of the first positions by repeating a processing of delivering the substrate from the first pick to the susceptor and from the susceptor to the first pick by controlling the transfer device and the elevating device and a processing of detecting the first position of the substrate, which is delivered from the susceptor to the first pick, by the detecting device, and the corrector corrects the position of the first pick based on a deviation amount between the average of the first positions and the reference position.

3. The substrate processing apparatus of claim 2, wherein the detector calculates an average of the second positions by repeating a processing of delivering the substrate from the first pick to the susceptor, from the susceptor to the second pick and from the second pick to the first pick by controlling the transfer device and the elevating device and a processing of detecting the second position of the substrate, which is delivered from the second pick to the first pick, by the detecting device, and the corrector corrects the position of the second pick based on a deviation amount between the average of the second positions and the first position of the substrate.

4. The substrate processing apparatus of claim 1, wherein the detector calculates an average of the second positions by repeating a processing of delivering the substrate from the first pick to the susceptor, from the susceptor to the second pick and from the second pick to the first pick by controlling the transfer device and the elevating device and a processing of detecting the second position of the substrate, which is delivered from the second pick to the first pick, by the detecting device, and the corrector corrects the position of the second pick based on a deviation amount between the average of the second positions and the first position of the substrate.

5. A transfer position correcting method performed by a control device of a substrate processing apparatus including a transfer device configured to transfer a substrate, the transfer device having a first pick configured to hold the substrate; a detecting device configured to detect a position of the substrate transferred by the transfer device; a processing chamber connected to a transfer chamber in which the transfer device and the detecting device are accommodated; a susceptor configured to place the substrate thereon, the susceptor being provided within the processing chamber; an elevating device configured to move the substrate up and down, the elevating device being configured to be protruded from and retreated into the susceptor; and the control device configured to control the transfer device and the elevating device, the transfer position correcting method comprising:

delivering the substrate from the first pick to the susceptor and from the susceptor to the first pick by controlling the transfer device and the elevating device, and detecting a first position of the substrate, which is delivered from the susceptor to the first pick, by the detecting device; and correcting a position of the first pick based on a deviation amount between the first position of the substrate and a previously detected reference position, wherein the transfer device further comprises a second pick configured to hold the substrate, the detecting of the first position comprises delivering the substrate from the first pick to the susceptor, from the susceptor to the second pick and from the second pick to the first pick by controlling the transfer device and the elevating device; and detecting a second position of the substrate, which is delivered from the second pick to the first pick, by the detecting device, and the correcting of the position comprises correcting a position of the second pick based on a deviation amount between the second position of the substrate and the first position of the substrate.

6. The transfer position correcting method of claim 5, wherein the detecting of the first position comprises calculating an average of the first positions by repeating a processing of delivering the substrate from the first pick to the susceptor and from the susceptor to the first pick by controlling the transfer device and the elevating device and a processing of detecting the first position of the substrate, which is delivered from the susceptor to the first pick, by the detecting device, and the correcting of the position comprises correcting the position of the first pick based on a deviation amount between the average of the first positions and the reference position.

7. The transfer position correcting method of claim 6, wherein the detecting of the second position comprises calculating an average of the second positions by repeating a processing of delivering the substrate from the first pick to the susceptor, from the susceptor to the second pick and from the second pick to the first pick by controlling the transfer device and the elevating device and a processing of detecting the second position of the substrate, which is delivered from the second pick to the first pick, by the detecting device, and the correcting of the position comprises correcting the position of the second pick based on a deviation amount between the average of the second positions and the first position of the substrate.

8. The transfer position correcting method of claim 5, wherein the detecting of the second position comprises calculating an average of the second positions by repeating a processing of delivering the substrate from the first pick to the susceptor, from the susceptor to the second pick and from the second pick to the first pick by controlling the transfer device and the elevating device and a processing of detecting the second position of the substrate, which is delivered from the second pick to the first pick, by the detecting device, and the correcting of the position comprises correcting the position of the second pick based on a deviation amount between the average of the second positions and the first position of the substrate.

* * * * *